US009570492B2

(12) United States Patent
Liu et al.

(10) Patent No.: US 9,570,492 B2
(45) Date of Patent: Feb. 14, 2017

(54) PIXEL ARRAY OF IMAGE SENSOR AND METHOD OF FABRICATING THE SAME

(71) Applicant: PixArt Imaging Inc., Hsin-Chu (TW)

(72) Inventors: Han-Chi Liu, Hsin-Chu (TW); Huan-Kun Pan, Hsin-Chu (TW); En-Feng Hsu, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 0 days.

(21) Appl. No.: 14/956,364

(22) Filed: Dec. 1, 2015

(65) Prior Publication Data

US 2016/0086990 A1 Mar. 24, 2016

Related U.S. Application Data

(63) Continuation-in-part of application No. 14/686,777, filed on Apr. 14, 2015, which is a continuation of application No. 13/427,912, filed on Mar. 23, 2012, now Pat. No. 9,093,342.

(30) Foreign Application Priority Data

Mar. 25, 2011 (TW) .............................. 100110307 A

(51) Int. Cl.
*G01J 5/00* (2006.01)
*H01L 27/146* (2006.01)

(52) U.S. Cl.
CPC ... *H01L 27/14621* (2013.01); *H01L 27/14627* (2013.01); *H01L 27/14685* (2013.01)

(58) Field of Classification Search
CPC .................. G02F 2201/52; G09G 2300/0452; G06T 2207/10024
See application file for complete search history.

(56) References Cited

U.S. PATENT DOCUMENTS

| 5,914,749 | A | * | 6/1999 | Bawolek | ........... | H01L 27/14621 257/E27.134 |
| 7,714,265 | B2 | | 5/2010 | Fadell | | |
| 8,564,580 | B2 | | 10/2013 | Sakai | | |
| 2004/0222999 | A1 | * | 11/2004 | Choi | .................... | G09G 3/3225 345/589 |
| 2005/0275769 | A1 | * | 12/2005 | Roh | .................. | G02F 1/133514 349/109 |
| 2007/0247572 | A1 | * | 10/2007 | Hung | ................ | G02F 1/133555 349/114 |

(Continued)

FOREIGN PATENT DOCUMENTS

| CN | 1310915 A | 8/2001 |
| CN | 101447145 A | 6/2009 |

(Continued)

*Primary Examiner* — Kiho Kim

(74) *Attorney, Agent, or Firm* — Winston Hsu; Scott Margo

(57) ABSTRACT

A pixel array of an image sensor includes multiple red, green, blue and panchromatic pixels. The red, green and blue pixels are formed on a substrate during a first process. Planarization material is deposited to form the panchromatic pixels on the substrate and to form a planarization layer on the red, green and blue pixels during the same second process subsequent to the first process. The planarization material of the panchromatic pixels and the planarization layer is characterized in high transmittance and high aspect ratio.

16 Claims, 4 Drawing Sheets

(56) References Cited

U.S. PATENT DOCUMENTS

| | | | |
|---|---|---|---|
| 2008/0128598 A1* | 6/2008 | Kanai | H01L 27/14621 |
| | | | 250/226 |
| 2008/0191298 A1 | 8/2008 | Lin | |
| 2008/0272987 A1* | 11/2008 | Lee | G02F 1/167 |
| | | | 345/55 |
| 2009/0021629 A1* | 1/2009 | Yamada | H01L 27/14627 |
| | | | 348/311 |
| 2009/0051984 A1* | 2/2009 | O'Brien | H04N 9/045 |
| | | | 358/514 |
| 2009/0135167 A1 | 5/2009 | Sakai | |
| 2009/0200622 A1* | 8/2009 | Tai | H01L 27/14621 |
| | | | 257/432 |
| 2009/0295973 A1* | 12/2009 | Oshikubo | H04N 5/3559 |
| | | | 348/311 |
| 2010/0231770 A1* | 9/2010 | Honda | G06T 3/4015 |
| | | | 348/308 |

FOREIGN PATENT DOCUMENTS

| | | | | |
|---|---|---|---|---|
| JP | 5585208 B2 * | 9/2014 | | H04N 5/2254 |
| TW | 482893 | 4/2002 | | |

\* cited by examiner

| P | R | P | R |
|---|---|---|---|
| B | G | B | G |
| P | R | P | R |
| B | G | B | G |

| G | P | R | P |
|---|---|---|---|
| G | P | R | P |
| B | P | G | P |
| B | P | G | P |

| P | B | P | G |
|---|---|---|---|
| B | P | G | P |
| P | G | P | R |
| G | P | R | P |

| G | P | R | P |
|---|---|---|---|
| B | P | G | P |
| G | P | R | P |
| B | P | G | P |

FIG. 3

PIXEL ARRAY OF IMAGE SENSOR AND METHOD OF FABRICATING THE SAME

CROSS REFERENCE TO RELATED APPLICATIONS

This application is a Continuation in Part of U.S. non-provisional application Ser. No. 14/686,777 filed on 2015 Apr. 14 which is a continuation application of U.S. non-provisional application Ser. No. 13/427,912 filed on 2012 Mar. 23.

BACKGROUND OF THE INVENTION

1. Field of the Invention

The present invention is related to a pixel array of an image sensor and a method of fabricating the same, and more particularly, to a pixel array of an image sensor with intermixing color-sensing and a method of fabricating the same

2. Description of the Prior Art

Light is the portion of electromagnetic radiation whose wavelength is between 300 nm (ultraviolet) to 14,000 nm (far infrared). The optical spectrum of visible light lies in a wavelength range from about 380 to about 780 nm. An image sensor configured to convert optical signals into electrical signals is widely used in digital cameras, cellular phones, surveillance, medical, automobile, and other applications. The pixel array of an image sensor normally includes color pixels such as red, green and blue pixels. Panchromatic pixels, also known as clear pixels or white pixels, may also be adopted for improving the sensitivity of the image sensor.

FIG. 1 is a diagram illustrating the cross-sectional view of a pixel array 10 in a conventional image sensor during different manufacturing stages. For illustrative purpose, only one red pixel R, one green pixel G, one blue pixel B and one panchromatic pixel P are depicted. At stage S1, the red pixel R, the green pixel G, the blue pixel B and the panchromatic pixel P are formed on a substrate 12. At stage S2, planarization material is deposited on the red pixel R, the green pixel G, the blue pixel B and the panchromatic pixel P to form the planarization layer 14. At stage S3, micro-lenses $L_R$, $L_G$, $L_B$ and $L_P$ are formed on the planarization layer 14 at locations corresponding to the red pixel R, the green pixel G, the blue pixel B and the panchromatic pixel P, respectively.

In the conventional pixel array 10, the color pixels R, G, B and the panchromatic pixel P are fabricated in difference processes. More specifically, at least one photo mask is required to define the pattern of the color pixels, and another photo mask is required to define the pattern of the panchromatic pixels. Although the panchromatic pixels can improve the sensitivity, they require using extra photo masks in an extra step, thereby increasing the complexity and cost of the manufacturing process.

SUMMARY OF THE INVENTION

The present invention provides a pixel array of an image sensor. The pixel array includes a first color pixel formed on a substrate and configured to sense light of a first optical spectrum; a panchromatic pixel formed on the substrate and configured to sense light of a second optical spectrum; and a planarization layer formed on the first color pixel and panchromatic pixel. The panchromatic pixel and the planarization layer have an integrated structure which is formed in a same process using a planarization material. A range of the second optical spectrum is larger than a range of the first optical spectrum.

The present invention also provides a method of fabricating a pixel array of an image sensor. The method includes forming at least one color pixel on a substrate during a first process; and filling a planarization material during a second process to form a panchromatic pixel on the substrate and a planarization layer on the first color pixel and the panchromatic pixel. The at least one color pixel is configured to sense light of a first optical spectrum. The panchromatic pixel is configured to sense light of a second optical spectrum. A range of the second optical spectrum is larger than a range of the first optical spectrum.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3 is a diagram illustrating the arrangement of the pixel array according to an embodiment of the present invention.

DETAILED DESCRIPTION

For ease and clarity of explanation, elements which are not directly associated with the present invention are omitted when describing preferred embodiments of the present invention. Meanwhile, the size and location of each described device are merely for illustrative purpose and do not intend to limit the scope of the present invention.

Figure 1:
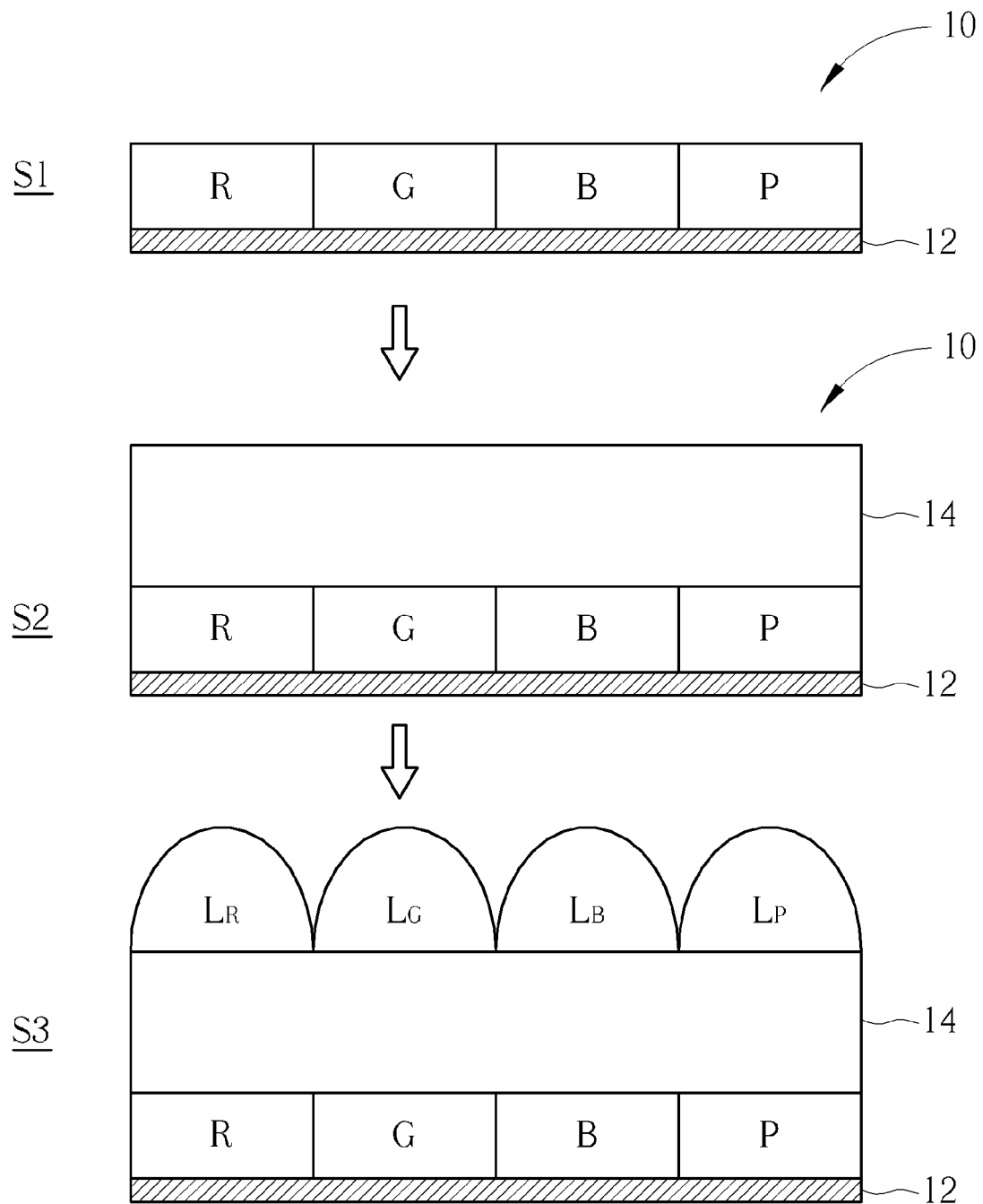
FIG. 1 is a diagram illustrating the cross-sectional view of a pixel array in a conventional image sensor during different manufacturing stages.
Figure 2:
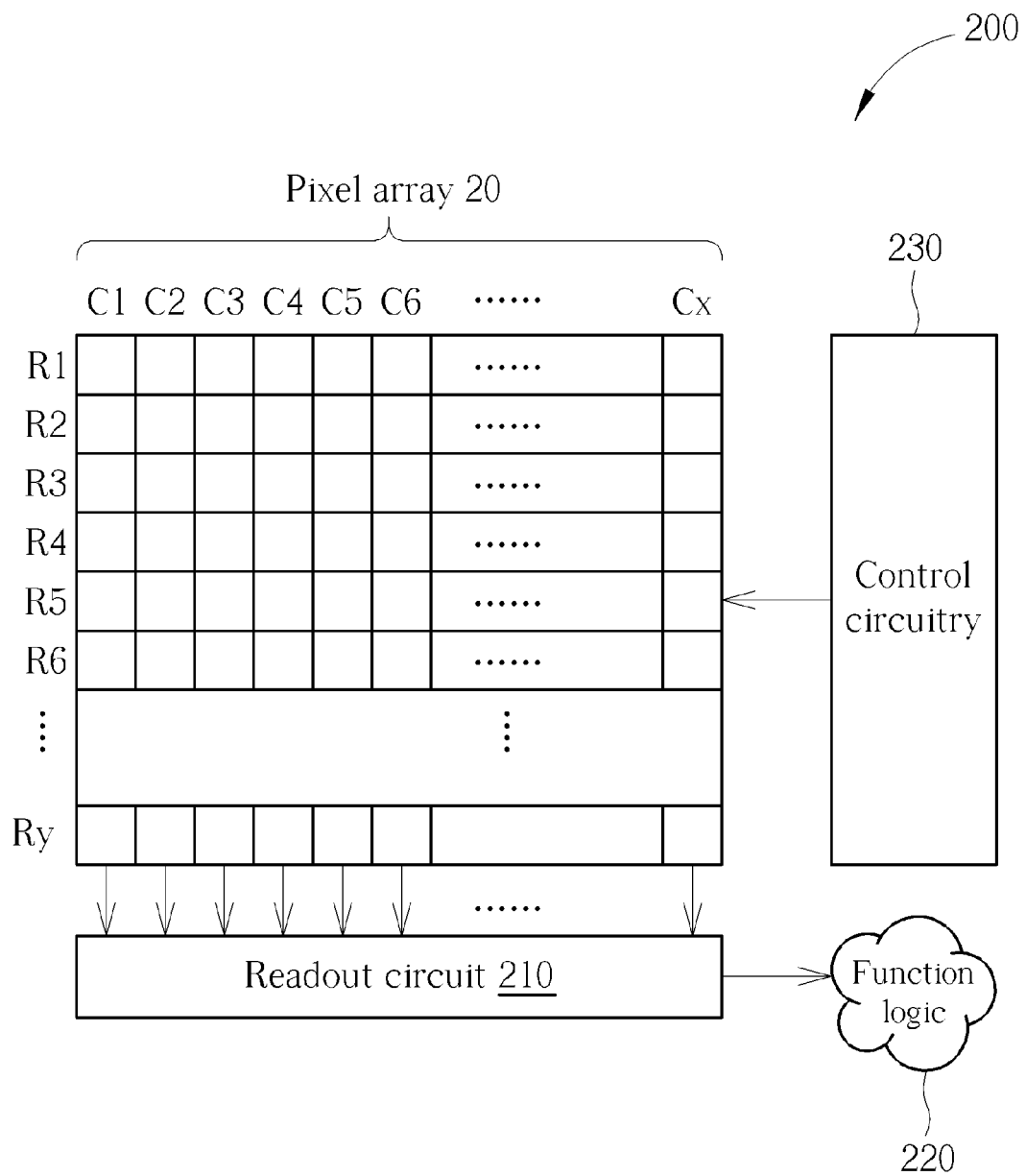
FIG. 2 is a functional diagram illustrating an image sensor according to an embodiment of the present invention.

FIG. 2 is a functional diagram illustrating an image sensor 200 according to an embodiment of the present invention. The image sensor 200 includes a pixel array 20, a readout circuitry 210, a functional logic 220, and a control circuitry 230. The pixel array 20 may be a two-dimensional array of back-side or front-side illuminated imaging pixels. The control circuitry 230 is coupled to the pixel array 20 to control operational characteristics of the pixel array 20. The pixel array 20 is configured to acquire image data of an object, which is then read out by the readout circuitry 210 and transferred to the functional logic 220. The functional logic 220 is configured to simply store the image data, or further configured to manipulate the image data by applying post image effects (e.g., crop, rotate, remove red eye, adjust brightness, adjust contrast, or otherwise).

As illustrated in FIG. 2, the pixel array 20 includes a plurality of pixels each arranged into a row (e.g., rows R1~Ry) and a column (e.g., column C1~Cx). The plurality of pixels include at least one type of color pixels and at least one panchromatic pixel. Each color pixel may sense light in a predetermined optical spectrum. For example, the pixel array 20 may include 3 types of color pixels, wherein red pixels only sense the red visible light (the light having wavelength between 600-780 nm), green pixels only sense the green visible light (the light having wavelength between 500-600 nm), and blue pixels only sense the blue visible light (the light having wavelength between 380-500 nm). The panchromatic pixel is receptive to all or substantially all incoming visible and infrared light or energy incident thereon. Each type of color pixels and the panchromatic pixel may be arranged according to a predetermined pattern.

FIG. 3 is a diagram illustrating the arrangement of the pixel array 20 according to an embodiment of the present invention. For illustrative purpose, a 4×4 pixel array 20 is depicted, wherein red pixels are denoted by R, green pixels are denoted by G, blue pixels are denoted by B, and panchromatic pixels are denoted by P. However, the size and the pixel arrangement of the pixel array 20 do not limit the scope of the present disclosure.

Figure 4:
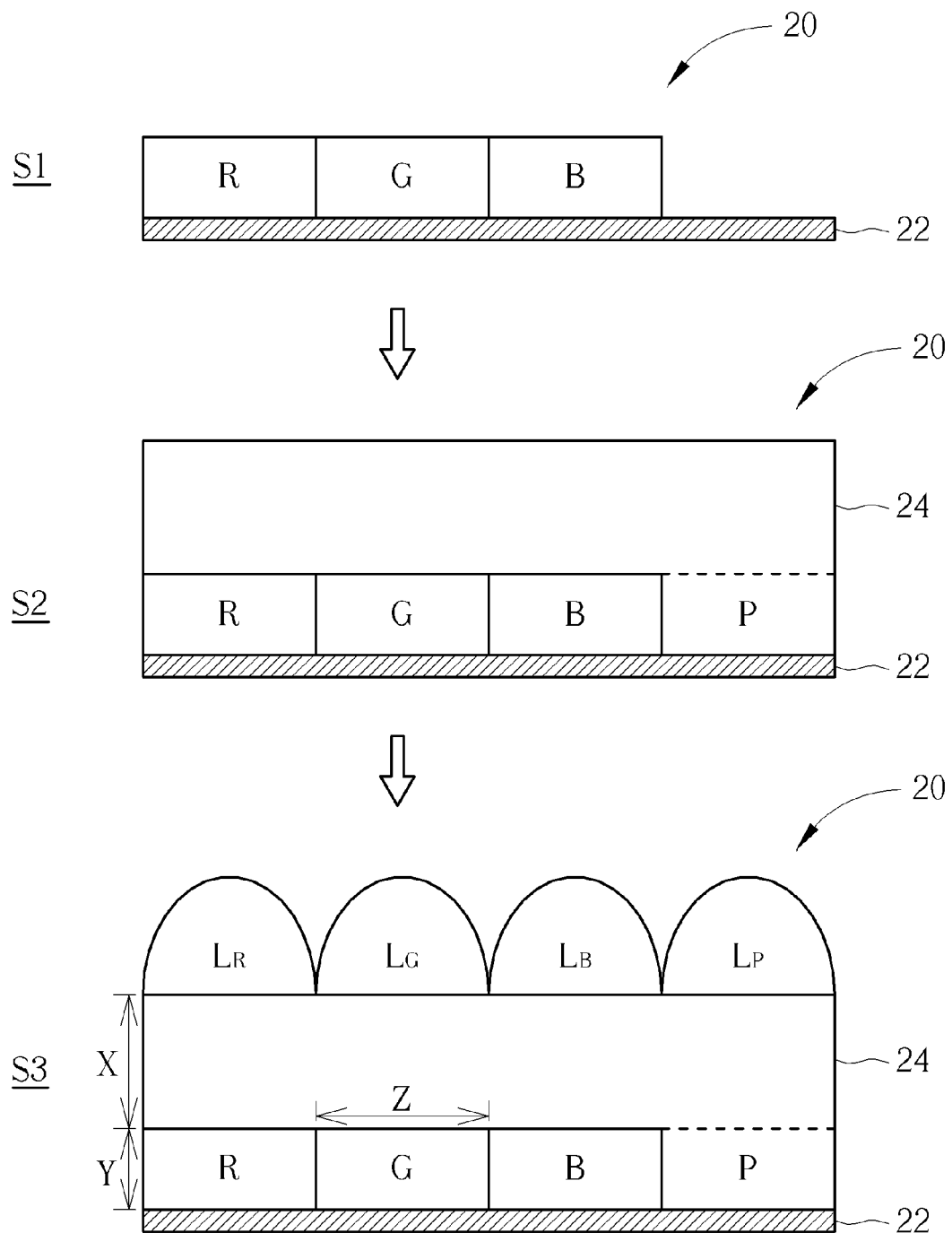
FIG. 4 is a diagram illustrating the cross-sectional view of a pixel array in an image sensor during different manufacturing stages according to an embodiment of the present invention.

FIG. 4 is a diagram illustrating the cross-sectional view of the pixel array 20 in the image sensor 200 during different manufacturing stages according to an embodiment of the present invention. For illustrative purpose, only one red pixel R, one green pixel G, one blue pixel B and one panchromatic pixel P are depicted.

At stage S1, the red pixel R, the green pixel G and the blue pixel B are formed on a substrate 22 having a plurality of photo diodes during a first process. The first process may include depositing color filter materials on photo diodes, patterning the color filter materials using photo masks, and removing photo masks. In an embodiment, each red pixel R includes a photo diode covered by red filter material so as to sense the red visible light, each green pixel G includes a photo diode covered by green filter material so as to sense the green visible light, and each blue pixel B includes a photo diode covered by blue filter material so as to sense the blue visible light. However, modifications and alterations may be made to the first process for fabricating the color pixels in the present invention.

At stage S2, planarization material is deposited to form the panchromatic pixel P on the substrate 22 and to form a planarization layer 24 on the red pixel R, the green pixel G, the blue pixel B and the panchromatic pixel P during the same second process subsequent to the first process. The second process includes filling the planarization material without using any photo mask for defining the panchromatic pixel P. More specifically, at the beginning of the second process, the planarization material is deposited on the substrate 12 to form the panchromatic pixels at locations where no color pixel is present. When the thickness of the panchromatic pixel P reaches that of the color pixels R, G and B, the planarization material is then deposited on the red pixel R, the green pixel G, the blue pixel B and the panchromatic pixel P to form the planarization layer 24. In other words, the panchromatic pixel P and the planarization layer 24 have an integrated structure in which the planarization material located between two color pixels serve as the panchromatic pixel P and the planarization material located above the surface of the color pixels serve as the planarization layer 24 (the boundary between the panchromatic pixel P and the planarization layer 24 is represented by a dash line in FIG. 4). By filling the planarization material between existing color pixels, the pattern of the panchromatic pixel P may be defined without using extra photo masks in an extra step. Therefore, the image sensor 200 according to the present invention can simplify the manufacturing process and reduce manufacturing costs.

At stage S3, a micro-lens $L_R$ is formed on the planarization layer 24 at a location corresponding to the red pixel R, a micro-lens $L_G$ is formed on the planarization layer 24 at a location corresponding to the red pixel G, a micro-lens $L_B$ is form on the planarization layer 24 at a location corresponding to the blue pixel B, and a micro-lens $L_P$ is on the planarization layer 24 at a location corresponding to the panchromatic pixel P during a third process subsequent to the second process. The thickness of the planarization layer 24 is denoted by X. The thickness of the pixels R, G, B and P is denoted by Y. The width of the pixels R, G, B and P is denoted by Z. Modifications and alterations may be made to the third process for fabricating the micro-lenses in the present invention.

In the present invention, the planarization material of the panchromatic pixel P and the planarization layer 24 is characterized in high transmittance and high aspect ratio. The transmittance of the planarization material with respect to the visible light (wavelength 350-780 nm) is preferably larger than 95%. The fraction of the thickness of the planarization layer 24 divided by the thickness of the pixels R, G, B and P (i.e. X/Y) is preferably between 4 and 6. For small pixel size, such as Z<3.75 um, the aspect ratio Y/Z is preferably between 0.1 and 0.4. For large pixel size, such as Z>3.75 um, the aspect ratio Y/Z is preferably between 0.1 and 0.2.

In the present invention, the micro-lenses $L_R$, $L_G$, $L_B$ and $L_P$ may be fabricated using the same planarization material for forming the planarization layer 24. However, the type of material for implementing the micro-lenses $L_R$, $L_G$, $L_B$ and $L_P$ does not limit the scope of the present invention.

In an embodiment of the present invention, the red pixel R, the green pixel G and the blue pixel B may be implemented by a corresponding type of selective light-sensing element. More specifically, a first type of light-sensing element sensitive to the optical spectrum of the red visible light may be used to fabricate the red pixel R, a second type of light-sensing element sensitive to the optical spectrum of the green visible light may be used to fabricate the green pixel G, and a third type of light-sensing element sensitive to the optical spectrum of the blue visible light may be used to fabricate the blue pixel B. However, the structure of the color pixels in the pixel array 20 does not limit the scope of the present invention.

In another embodiment of the present invention, the red pixel R, the green pixel G and the blue pixel B may be implemented by a planar array of non-selective light-sensing element coated with various types of optical films at locations corresponding to the color pixels. For example, a red optical film coated on the planar array of light-sensing element at the locations corresponding to the red pixel R only sense the red visible light (i.e. blocking light whose wavelength is not between 600-780 nm). A green optical film $C_G$ coated on the planar array of light-sensing element at the locations corresponding to the green pixel G only sense the green visible light (i.e. blocking light whose wavelength is not between 500-600 nm). A blue optical film coated on the planar array of light-sensing element at the locations corresponding to the blue pixel B only sense the blue visible light (i.e. blocking light whose wavelength is not between 380-500 nm).

In the present invention, the pixel array 20 in the image sensor 200 may be fabricated so that the panchromatic pixel P may be located between two color pixels of the same types (such as between two red pixels R, between two green pixels G or between two blue pixels B) or located between two different types of color pixels (such as between a red pixel R and a green pixel G, between a green pixel G and a blue pixel B, or between a red pixel R and a blue pixel B). However, the layout of the pixel array 20 does not limit the scope of the present invention.

In conclusion, the optical sensor according to the present invention can improve sensitivity using panchromatic pixels without increasing the complexity and cost of the manufacturing process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel array of an image sensor, comprising:
a first color pixel formed on a substrate and configured to sense light of a first optical spectrum;
a panchromatic pixel formed on the substrate and configured to sense light of a second optical spectrum; and
a planarization layer formed on the first color pixel and panchromatic pixel, wherein:
the panchromatic pixel and the planarization layer have an integrated structure which is formed in a same process using a planarization material; and
a range of the second optical spectrum is larger than a range of the first optical spectrum.

2. The pixel array of claim 1, wherein:
the light of the first optical spectrum is one of red visible light, green visible light or blue visible light; and
the light of the second optical spectrum includes the red visible light, the green visible light and the blue visible light.

3. The pixel array of claim 1, further comprising:
a first micro-lens formed on the planarization layer at a location corresponding to the first color pixel.

4. The pixel array of claim 3, wherein the first micro-lens is fabricated using the planarization material.

5. The pixel array of claim 1, wherein a transmittance of the planarization material with respect to the second optical spectrum is larger than 95%.

6. The pixel array of claim 1, wherein:
a fraction of a thickness of the planarization layer divided by a thickness of the panchromatic pixel is between 4 and 6.

7. The pixel array of claim 1, wherein:
a fraction of a thickness of the panchromatic pixel divided by a width of the panchromatic pixel is between 0.1 and 0.4 when the width of the panchromatic pixel is smaller than 3.75 um; or
the fraction of the thickness of the panchromatic pixel divided by the width of the panchromatic pixel is between 0.1 and 0.2 when the width of the panchromatic pixel is not smaller than 3.75 um.

8. The pixel array of claim 1, wherein the first pixel comprises one of a first type of selective light-sensing element sensitive to red visible light, a second type of selective light-sensing element sensitive to green visible light, and a third type of selective light-sensing element sensitive to blue visible light.

9. The pixel array of claim 1, wherein the first pixel comprises at least one optical film coated on a non-selective light-sensing element so as to block light outside the first optical spectrum.

10. The pixel array of claim 1, further comprising:
a second color pixel formed on the substrate and configured to sense light of a third optical spectrum;
a third color pixel formed on the substrate and configured to sense light of a fourth optical spectrum, wherein:
the planarization layer is formed on the second color pixel and the third color pixel;
the light of the first optical spectrum is red visible light;
the light in the third optical spectrum is green visible light;
the light in the fourth optical spectrum is blue visible light; and
the light of the second optical spectrum includes the red visible light, the green visible light and the blue visible light.

11. The pixel array of claim 10, further comprising:
a first micro-lens formed on the planarization layer at a first location corresponding to the first color pixel;
a second micro-lens formed on the planarization layer at a second location corresponding to the second color pixel; and
a third micro-lens formed on the planarization layer at a third location corresponding to the third color pixel.

12. A method of fabricating a pixel array of an image sensor, comprising:
forming at least one color pixel on a substrate during a first process; and
filling a planarization material during a second process to form a panchromatic pixel on the substrate and a planarization layer on the first color pixel and the panchromatic pixel, wherein:
the at least one color pixel is configured to sense light of a first optical spectrum;
the panchromatic pixel is configured to sense light of a second optical spectrum; and
a range of the second optical spectrum is larger than a range of the first optical spectrum.

13. The method of claim 12, further comprising:
forming a first micro-lens on the planarization layer at a first location corresponding to the at least one color pixel;
forming a second micro-lens on the planarization layer at a second location corresponding to the panchromatic pixel.

14. The method of claim 12, wherein a transmittance of the planarization material with respect to the second optical spectrum is larger than 95%.

15. The method of claim 12, wherein:
a fraction of a thickness of the planarization layer divided by a thickness of the panchromatic pixel is between 4 and 6.

16. The method of claim 12, wherein:
a fraction of a thickness of the panchromatic pixel divided by a width of the panchromatic pixel is between 0.1 and 0.4 when the width of the panchromatic pixel is smaller than 3.75 um; or
the fraction of the thickness of the panchromatic pixel divided by the width of the panchromatic pixel is between 0.1 and 0.2 when the width of the panchromatic pixel is not smaller than 3.75 um.

* * * * *